United States Patent
Hu

(10) Patent No.: US 9,859,213 B2
(45) Date of Patent: Jan. 2, 2018

(54) METAL VIA STRUCTURE

(71) Applicant: Dyi-Chung Hu, Hsinchu (TW)

(72) Inventor: Dyi-Chung Hu, Hsinchu (TW)

( * ) Notice: Subject to any disclaimer, the term of this patent is extended or adjusted under 35 U.S.C. 154(b) by 0 days.

(21) Appl. No.: 15/370,109

(22) Filed: Dec. 6, 2016

(65) Prior Publication Data
US 2017/0162497 A1 Jun. 8, 2017

Related U.S. Application Data

(60) Provisional application No. 62/264,086, filed on Dec. 7, 2015.

(51) Int. Cl.
*H01L 23/48* (2006.01)
*H01L 23/528* (2006.01)
*H01L 23/532* (2006.01)
*H01L 21/768* (2006.01)

(52) U.S. Cl.
CPC ........ *H01L 23/528* (2013.01); *H01L 21/7685* (2013.01); *H01L 21/76895* (2013.01); *H01L 23/53214* (2013.01); *H01L 23/53228* (2013.01); *H01L 23/53242* (2013.01); *H01L 23/53266* (2013.01)

(58) Field of Classification Search
CPC ............. H01L 23/528; H01L 23/53214; H01L 23/53228; H01L 23/53242
USPC .................................................. 257/774, 758
See application file for complete search history.

(56) References Cited

U.S. PATENT DOCUMENTS

| | | | | |
|---|---|---|---|---|
| 7,276,799 B2* | 10/2007 | Lee | ............... | H01L 21/76898 257/774 |
| 8,399,989 B2* | 3/2013 | Lin | ............... | H01L 23/3157 257/758 |
| 8,492,808 B2* | 7/2013 | Omori | ............... | H01L 27/228 257/295 |
| 2001/0051426 A1* | 12/2001 | Pozder | ............... | H01L 24/03 438/666 |
| 2008/0297496 A1* | 12/2008 | Watson | ............... | G06F 1/1601 345/206 |
| 2012/0273960 A1 | 11/2012 | Park et al. | | |
| 2014/0061924 A1* | 3/2014 | Chen | ............... | H01L 23/481 257/758 |
| 2015/0177310 A1* | 6/2015 | Roehner | ............ | G01R 19/0092 324/762.01 |

* cited by examiner

Primary Examiner — Nitin Parekh
(74) Attorney, Agent, or Firm — JCIPRNET1

(57) ABSTRACT

A filled metal via having an adhesive layer configured on bottom is disclosed. The adhesive layer enhances bonding force between the filled metal via and a bottom element. Further, stacked metal vias can be made to save spaces to enhance circuit density for an electronic system.

15 Claims, 3 Drawing Sheets

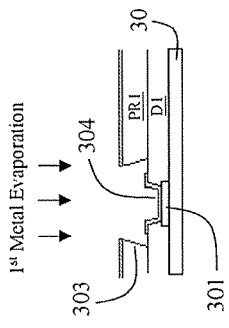
Fig.2B
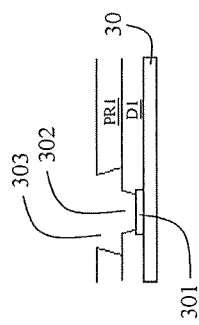
Fig.2C
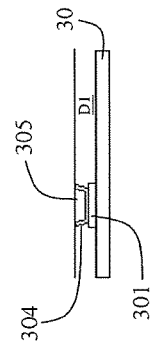
Fig.2F
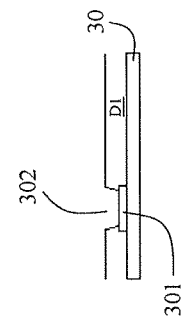
Fig.2A
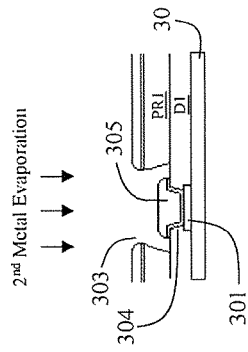
Fig.2D
Fig.2E

METAL VIA STRUCTURE

RELATED APPLICATIONS

The present application claims the benefit of U.S. Provisional Application No. 62/264,086, filed Dec. 7, 2015, the disclosure of which is hereby incorporated by reference herein in its entirety.

BACKGROUND

Technical Field

The present invention relates to a metal via structure, especially relates to a filled metal via structure which has an adhesive layer lying on bottom. The adhesive layer enhances bonding forces between the metal block and a bottom element.

Description of Related Art

FIG. 1 shows a prior art.

FIG. 1 shows that US2012/0273960 discloses a semiconductor package. A semiconductor die 124 is embedded in an encapsulant 194. The semiconductor die 124 has a plurality of through silicon via (TSV) 132 within the die 124, and has a plurality of through mold via (TMV) 200 within the encapsulant 194. A top build-up structure 202 and a bottom build-up structure 210 are made for external interconnect for the semiconductor package. The top build-up structure 202 has a redistribution circuitry 204, the bottom build-up structures 210 has a redistribution circuitry 212. A plurality of solder balls 216 are configured on a bottom side of the package.

The disadvantage for the prior is that the redistribution circuitry 204 has a first conformal metal via 20A and a second metal via 20B. An offset 22 is needed between the first metal via 20A and 20B in a lateral side. The offset 22 needs more space for circuitry layout and consumes more substrate area. It is a long desire to enhance circuit density higher and higher in the semiconductor device technology. It is noticed that the offset between two metal vias not only wastes substrate used but also reduces circuit density.

BRIEF DESCRIPTION OF THE DRAWINGS

FIGS. 2A~2J show a fabrication process embodiment according to the present invention.

DETAILED DESCRIPTION OF THE INVENTION

Figure 1:
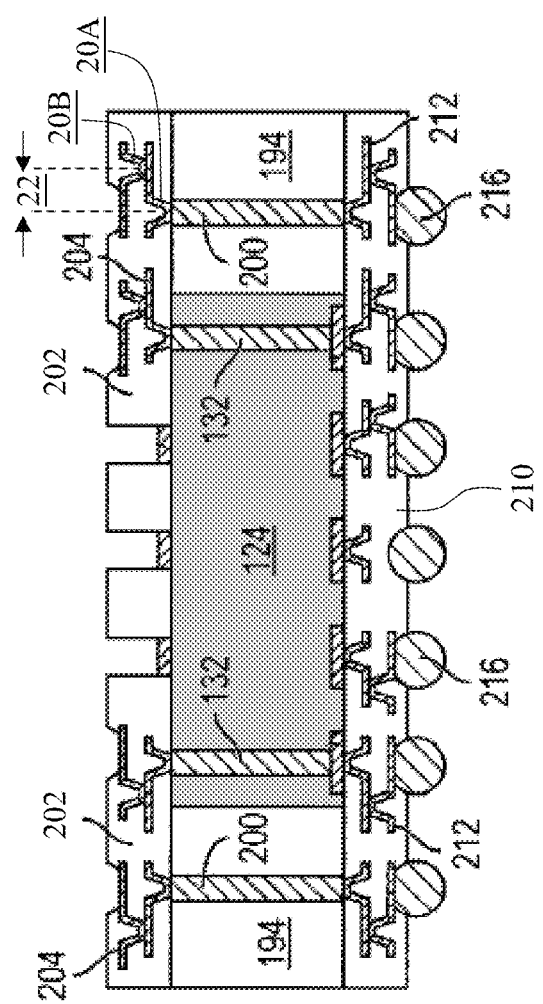
FIG. 1 shows a prior art.

A filled metal via having an adhesive layer configured on bottom is disclosed. The adhesive layer enhances bonding force between the filled metal via and a bottom element. Further, stacked metal vias can be made to not only save spaces but also enhance circuit density for an electronic device. A shorter circuit not only enhances signal intensity but also lessens signal transmission time.

The adhesive layer according to the present invention has a thickness roughly of 0.3 um and can be made as thick as 1 um depending on design choices. The metal circuit according to the present invention can be one of Gold (Au), Silver (Ag), Copper (Cu), Aluminum (Al) or equivalents. The adhesive layer according to the present invention can be one of Titanium (Ti), Chromium (Cr), Niobium (Nb), Tungsten (W), and Titanium Tungsten (TiW).

FIGS. 2A-2J show a fabrication process embodiment according to the present invention.

FIG. 2A shows: preparing a substrate 30 with at least a metal pad 301 configured thereon; a first dielectric layer D1 is configured on a top surface of the substrate 30; the first dielectric layer D1 has a first opening 302 and the metal pad 301 has a top surface exposed from the opening 302 of the first dielectric layer D1. The metal pad 301 as shown in the figure is an example only, which can be replaced by a metal circuit or a metal pillar such as a through silicon via (TSV), through glass via (TGA), or a through mold via (TMV) . . . etc.

Figure 2H:
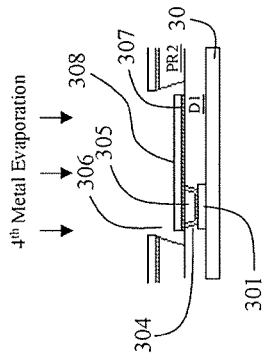
Figure 2I:
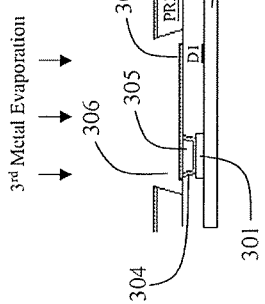
Figure 2J:
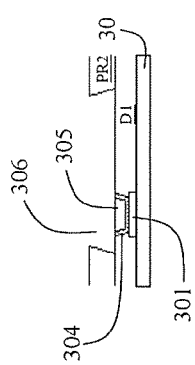
Figure 2G:
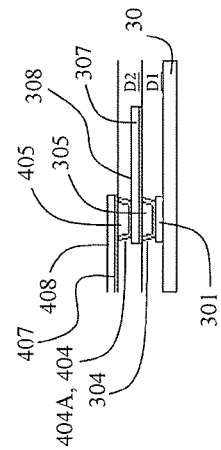

FIG. 2B shows: applying a patterned first photoresist PR1 on a top surface of the first dielectric layer D1, the first photoresist PR1 has a second opening 303 aligned with the first opening 302;

FIG. 2C shows: performing a first metal evaporation to form a first adhesive layer 304, the first adhesive layer 304 is conformably distributed on a wall surface of the first opening 302 and on a top surface of the exposed area of the metal pad 301;

FIG. 2D shows: performing a second metal evaporation to form a first metal block 305 on a top surface of the first adhesive layer 304;

FIG. 2E shows: stripping the first photoresist PR1;

FIG. 2F shows: flattening the first metal block 305 so that the first metal block 305 has a top surface coplanar with a top surface of the first dielectric layer D1;

FIG. 2G shows: applying a patterned second photoresist PR2, the second photoresist PR2 has a third opening 306 which covers at least a top surface of the first metal block 305;

FIG. 2H shows: performing a third metal evaporation to form a second adhesive layer 307 on a top surface of the first dielectric layer D1; the second adhesive layer 307 covers at least a top surface of the first metal block 305;

FIG. 2I shows: performing a fourth metal evaporation to form a first metal circuit 307 on a top surface of the second adhesive layer 307;

FIG. 2J shows: stripping the second photoresist PR2.

Figure 3:
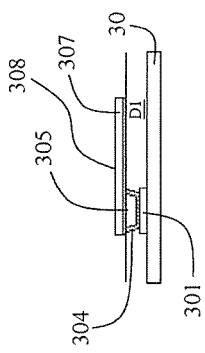
FIG. 3 shows a modified embodiment according to the present invention.

FIG. 3 shows a modified embodiment according to the present invention.

A second metal via structure can be made and stacked on a top surface of the first metal via through a similar fabrication process.

FIG. 3 shows: forming a second dielectric layer D2 on a top surface of the first metal circuit 308; the second dielectric layer D2 has an opening 404A aligned with the first metal block 305; the opening 404A exposes an area of the first metal circuit 308;

forming a third adhesive layer 404 to cover at least a top surface of the exposed area 404 of the first metal circuit 308;

forming a second metal block 405 on a top surface of the third adhesive layer so that the second metal block 405 is aligned with the first metal block 305; wherein the second metal block 405 has a top surface coplanar with a top surface of the second dielectric layer D2;

forming a fourth adhesive layer 407 on a top surface of the second dielectric layer D2; the fourth adhesive layer 407 has a first end extended to cover a top surface of the second metal block 405; and forming a second metal circuit 408 on a top surface of the fourth adhesive layer 407.

While several embodiments have been described by way of example, it will be apparent to those skilled in the art that various modifications may be configured without departs

| Numerical system | |
|---|---|
| 30 | substrate |
| 301 | metal pad |
| 302 | first opening |
| 303 | second opening |
| 304 | first adhesive layer |
| 305 | first metal block |
| 306 | third opening |
| 307 | second adhesive layer |
| 308 | first metal circuit |
| 404 | third adhesive layer |
| 404A | opening |
| 405 | second metal block |
| 407 | fourth adhesive layer |
| 408 | second metal circuit |
| D1 | first dielectric layer |
| D2 | second dielectric layer |
| PR1 | first photoresist |
| PR2 | second photoresist |

What is claimed is:

1. A metal via structure, comprising:
a bottom metal, having a top surface exposed from a first dielectric layer;
a first adhesive layer, configured on a top surface of the bottom metal;
a first metal block, configured on a top surface of the first adhesive layer; having a top surface coplanar with a top surface of the first dielectric layer;
a second adhesive layer, configured on the top surface of the first dielectric layer; having a first end extended to cover a top surface of the first metal block; and a first metal circuit, configured on a top surface of the second adhesive layer; and
a second dielectric layer, configured on a top surface of the first metal circuit; a top surface of an area of the first metal circuit aligned with the first metal block as seen in a plan view, exposed from the second dielectric layer; a third adhesive layer, configured on the top surface of the exposed area of the first metal circuit; and a second metal block, configured on a top surface of the third adhesive layer, having a top surface coplanar with a top surface of the second dielectric layer.

2. A metal via structure as claimed in claim 1, wherein the first adhesive layer extends to wrap side surfaces of the first metal block so that the metal block does not contact with the first dielectric layer directly.

3. A metal via structure as claimed in claim 1, wherein the first metal block is a conductive material selected from a group consisting of Au, Ag, Cu and Al.

4. A metal via structure as claimed in claim 1, wherein the first adhesive layer is a conductive material selected from a group consisting of Ti, Cr, Nb, W, and TiW.

5. A metal via structure as claimed in claim 1, wherein the first adhesive layer has a thickness less than 1 um.

6. A metal via structure as claimed in claim 5, wherein the first adhesive layer has a thickness roughly of 0.3 um.

7. A metal via structure as claimed in claim 1, wherein the bottom metal is selected from a group consisting of a metal pad, metal circuit, through silicon via, through glass via, and through mold via.

8. A metal via structure as claimed in claim 1, wherein the first metal circuit is a conductive material selected from a group consisting of Au, Ag, Cu and Al.

9. A metal via structure as claimed in claim 1, wherein the second adhesive layer is a conductive material selected from a group consisting of Ti, Cr, Nb, W, and TiW.

10. A metal via structure as claimed in claim 1, wherein the third adhesive layer extends to wrap side surfaces of the second metal block.

11. A metal via structure as claimed in claim 1, wherein the second metal block is a conductive material selected from a group consisting of Au, Ag, Cu and Al.

12. A metal via structure as claimed in claim 1, wherein the third adhesive layer is a conductive material selected from a group consisting of Ti, Cr, Nb, W, and TiW.

13. A metal via structure as claimed in claim 1, wherein the third adhesive layer has a thickness less than 1 um.

14. A metal via structure as claimed in claim 13, wherein the first adhesive layer has a thickness roughly of 0.3 um.

15. A metal via structure as claimed in claim 1, further comprising: a fourth adhesive layer, configured on the top surface of the second dielectric layer; having an end extended to cover a top surface of the second metal block; and a second metal circuit, configured on the top surface of the fourth adhesive layer.

* * * * *